(12) United States Patent
Driscoll et al.

(10) Patent No.: US 7,737,087 B2
(45) Date of Patent: Jun. 15, 2010

(54) ENHANCED PINNING IN YBCO FILMS WITH BAZRO$_3$ NANOPARTICLES

(75) Inventors: Judith L. Driscoll, Los Alamos, NM (US); Stephen R. Foltyn, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 1537 days.

(21) Appl. No.: 10/900,639

(22) Filed: Jul. 27, 2004

(65) Prior Publication Data

US 2006/0025310 A1  Feb. 2, 2006

(51) Int. Cl.
*H01B 12/00* (2006.01)
*H01L 39/00* (2006.01)

(52) U.S. Cl. ............... 505/470; 505/320; 505/430; 505/237; 428/930; 428/701; 428/702

(58) Field of Classification Search ........... 505/100, 505/230, 320, 237, 238, 447, 474, 730; 428/469, 428/472, 373, 402; 427/62, 126.3
See application file for complete search history.

(56) References Cited

U.S. PATENT DOCUMENTS

| 5,089,455 | A | 2/1992 | Ketcham et al. |
|---|---|---|---|
| 5,508,255 | A | 4/1996 | Eddy |
| 5,814,262 | A | 9/1998 | Ketcham et al. |
| 6,074,990 | A | 6/2000 | Pique et al. |
| 6,077,304 | A | 6/2000 | Kasuya |
| 6,235,402 | B1 | 5/2001 | Shoup et al. |
| 6,794,339 | B2 * | 9/2004 | Wiesmann et al. ......... 505/470 |
| 6,869,915 | B2 * | 3/2005 | Weinstein ............... 505/320 |
| 2003/0054105 | A1 * | 3/2003 | Hammond et al. ......... 427/294 |
| 2005/0159298 | A1 * | 7/2005 | Rupich et al. ............. 502/100 |

OTHER PUBLICATIONS

Kim et al, "Formation of BaCeO3 and its influence on microstructure of sintered/melt-textured Y-Ba-Cu-O oxides with CeO2 addition," J. Materials. Res. Aug. 1994, Abstract.*

* cited by examiner

*Primary Examiner*—Stanley Silverman
*Assistant Examiner*—Kallambella Vijayakumar
(74) *Attorney, Agent, or Firm*—Bruce H. Cottrell

(57) ABSTRACT

A process and composition of matter are provided and involve flux pinning in thin films of high temperature superconductive oxides such as YBCO by inclusion of particles including barium and a group 4 or group 5 metal, such as zirconium, in the thin film.

7 Claims, 4 Drawing Sheets

ENHANCED PINNING IN YBCO FILMS WITH BAZRO₃ NANOPARTICLES

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to composition of matter including a high temperature superconductive oxide and particles dispersed therein, such particles including barium and a group 4 or group 5 metal such as zirconium, cerium and the like, and to methods of providing pinning in high temperature superconductive oxide films by addition of a group 4 metal compound or group 5 metal compound such as a zirconium compound, a cerium compound and the like, during formation of the high temperature superconductive oxide films.

BACKGROUND OF THE INVENTION

It has been known that barium zirconate ($BaZrO_3$) has a low reactivity with yttrium-barium-copper oxides (e.g., $Y_1Ba_2Cu_3O_x$ generally shown as YBCO). For this reason, single crystals of YBCO have often been grown in $BaZrO_3$-coated crucibles. Detailed studies of the reactivity have shown that certain reaction by-products, such as $YBa_2ZrO_6$ and $BaZr_{1-x}Cu_xOy$, can form. Further references have described addition of $BaZrO_3$ particles of about 100 nm in size to bulk melt-processed YBCO, but the $BaZrO_3$ was found to agglomerate at the growth front of the grains and seeded YBCO grains, leading to multigrain growth (see Luo et al., J. Supercon. 13(4), pp. 575-581 (2000)).

Other instances of $BaZrO_3$ with superconductive structures are known. For example, U.S. Pat. Nos. 6,077,304 and 6,235,402 by Goyal et al. describe use of barium zirconate as a buffer layer on a lanthanum aluminate layer on a nickel base substrate. Such layers are deposited by sol-gel techniques. U.S. Pat. Nos. 5,508,255 and 6,074,990 also describe barium zirconate as a buffer layer. U.S. Pat. Nos. 5,089,455 and 5,814,262 describe reaction of YBCO on a zirconia substrate to form a thin layer of barium zirconate at the interface. However, in none of the previous work has $BaZrO_3$ been known or used to form pinning centers for superconductive thin film structures, especially a thin film YBCO structure. Other barium oxides including a group 4 or group 5 metal such as cerium and the like may be employed as well.

SUMMARY OF THE INVENTION

In accordance with the purposes of the present invention, as embodied and broadly described herein, the present invention provides a composition of matter comprising a thin film of a high temperature superconductive oxide having particles randomly dispersed therein, said particles comprised of barium and a group 4 or group 5 metal. In one embodiment, the group 4 or group 5 metal is zirconium.

The present invention further provides a process of forming a superconductive oxide thin film including particles comprised of barium and a group 4 or group 5 metal randomly dispersed therein by depositing the thin film of high temperature superconductive oxide from precursor materials for the high temperature superconductive oxide and a group 4 or group 5 metal compound. In one embodiment, the group 4 or group 5 metal is zirconium.

The present invention further provides a process of providing flux pinning to high temperature superconductive oxide films by incorporation of particles including barium and a group 4 or group 5 metal into the high temperature superconductive oxide films. In one manner of the present invention, the addition of such particles can be by preparation of the thin film of high temperature superconductive oxide from precursor materials for the high temperature superconductive oxide and a group 4 or group 5 metal compound, and optionally a barium compound. In one embodiment, the group 4 or group 5 metal is zirconium.

DETAILED DESCRIPTION

Figure 1:
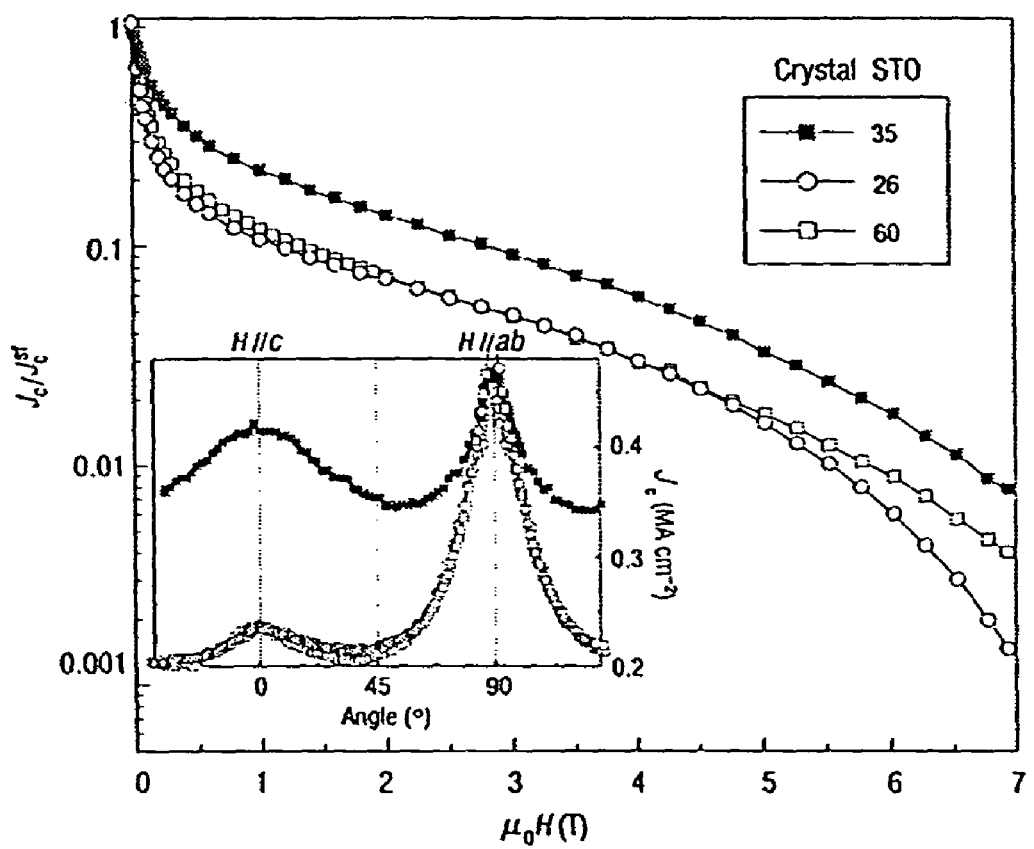
FIG. 1 shows a graph plotting normalized critical current ($J_c/J_c^{sf}$) versus magnetic field applied parallel to the c-axis at T=75.5 K for a barium zirconate doped YBCO sample grown on a $SrTiO_3$ single crystal substrate.

The present invention is concerned with high temperature superconductive thin films including particles of barium and a group 4 or group 5 metal such as zirconium, e.g., $BaZrO_3$ particles and the like, whereby improved performance in high magnetic fields can be obtained. Such particles can be nanoparticles in size. These nanoparticles can be formed within the high temperature superconductive films during initial film formation by addition of a group 4 or group 5 metal compound, such as a zirconium compound.

In the present invention, the addition or in situ formation of a second phase material including a group 4 or group 5 metal and having a close lattice match to the high temperature superconductive material can lead to introduction of strain into the thin film thereby generating dislocations that can yield flux pinning within the thin film. The second phase material should not lead to substitution of elements into the high temperature superconductive material whereby the superconducting properties of the high temperature superconductive material are detrimentally diminished.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. A mixture of the rare earth metal europium with yttrium may be one preferred combination. Other superconducting materials such as bismuth and thallium based superconductor materials may also be employed. $YBa_2Cu_3O_{7-\delta}$ is generally preferred as the superconducting material.

The group 4 or group 5 metal can be from among zirconium, cerium, niobium and hafnium, and is preferably zirconium. The particles comprised of barium and a group 4 or group 5 metal can be particles, e.g., of barium zirconate ($BaZrO_3$), barium cerate ($BaCeO_3$), barium hafnate ($BaHfO_3$), and barium niobate ($BaNbO_3$). The particles including barium and zirconium incorporated into the high temperature superconductive oxide are preferably particles of barium zirconate ($BaZrO_3$) or of $Ba_2ZrYO_6$. Other equivalent compositions may be expected from other group 4 and group 5 metals.

In an embodiment of the present invention with YBCO as the high temperature superconducting (HTS) material, YBCO films including particles of barium and zirconium, such as $BaZrO_3$ nanoparticles, provided improved performance compared with films of only YBCO, especially for coated conductor applications. Specifically, the improved performance by the YBCO films including particles of barium and zirconium was found for operation within high magnetic fields, i.e., fields of from about 0.1 Tesla to about 10 Tesla.

High temperature superconducting (HTS) layers, e.g., a YBCO layer, can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating. The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 1 millimeter (mm) by 4 mm with an average energy density of from about 1 to 4 joules per square centimeter ($J/cm^2$). After deposition, the films generally are cooled within an oxygen atmosphere of greater than about 100 Torr to room temperature.

The thin films of high temperature superconducting materials are generally from about 0.2 microns to about 2 microns in thickness, more preferably in the range of from about 0.6 μm to about 2 μm.

In the present invention, the high temperature superconducting material can be upon any suitable base substrate. For coated conductors of a high temperature superconducting material such as YBCO, the base substrate can be, e.g., a polycrystalline material such as polycrystalline metals or polycrystalline ceramics or can be a single crystal base substrate such as lanthanum aluminum oxide, aluminum oxide, magnesium oxide and the like. Also, the initial or base substrate can be an amorphous substrate such as silica or glass. In one embodiment, the base substrate can be a polycrystalline metal such as a metal alloy. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the base substrate can be a polycrystalline ceramic such as polycrystalline aluminum oxide, polycrystalline yttria-stabilized zirconia (YSZ), forsterite, yttrium-iron-garnet (YIG), silica and the like.

The ultimate application can determine the selection of the material for the base substrate. For example, the selection of the base substrate on which subsequent superconducting material (e.g., YBCO) is deposited can allow for the resultant article to be flexible whereby superconducting articles (e.g., coils, motors or magnets) can be shaped. Thus, for superconducting applications requiring flexible substrates, the base substrate is generally a polycrystalline metal as these materials are usually flexible, i.e., they can be shaped. For other applications, the base substrate on which other oriented materials are deposited may be polycrystalline ceramics, either flexible or non-flexible. For still other applications, the base substrate may be a single crystal substrate such as magnesium oxide, lanthanum aluminate, or aluminum oxide.

In one embodiment, the particles including barium and zirconium can be incorporated into the high temperature superconductive oxide by in situ growth in a co-deposition process. Where the high temperature superconductive oxide is YBCO, precursor materials including yttrium, barium and copper are already employed in forming the final YBCO. In the process of the present invention, a precursor material including zirconium can be included. In one approach, a precursor material providing excess barium from that needed to form a superconducting YBCO material can be included with the starting materials together with a precursor material providing zirconium so as to allow the in situ formation of barium zirconate particles. The precursor material providing the excess barium from that needed to form a superconducting YBCO material, can be the same precursor material used to supply the barium for the YBCO or can be a different precursor material. In another approach, the precursor materials can include those materials typically used in forming the YBCO and a precursor material providing zirconium for the in situ formation of barium zirconate particles. As it is known that YBCO compositions can be slightly deficient in barium content without the loss of superconducting properties, barium zirconate particles can be formed by only the addition of zirconium from a zirconium containing precursor material.

In the present invention, the group 4 or group 5 metal can be added in the form of a group 4 or group 5 metal compound such as an oxide or may be added as the metal. For example, zirconium can be added in the form of a zirconium compound such as zirconium oxide or may be added as zirconium metal. The amount of group 4 or group 5 metal added can generally range from about 1 mole percent to about 10 mole percent and about 5 mole percent has be shown to yield a positive effect on flux pinning.

Other particles of a rare earth metal oxide ($RE_2O_3$) can also be incorporated into the thin film together with the particles of a barium and group 4 or group 5 metal compound. The rare earth metal can generally be any rare earth metal. Among suitable particles of a rare earth metal oxides are included particles of yttrium oxide. Yttrium oxide particles can be formed in situ by addition of, e.g., a precursor material of yttrium oxide ($Y_2O_3$) and the like to the precursor materials for the high temperature superconductive oxide.

The present invention is more particularly described in the following examples that are intended as illustrative only, since numerous modifications and variations will be apparent to those skilled in the art.

Example 1

Ceramic targets were prepared from: (a) pure YBCO; and (b) YBCO with 5 mole percent $BaZrO_3$. Commercial YBCO powder was used, as well as 99.99% pure powders of $BaNO_3$ and $ZrO_2$ in the preparation of the targets. The powders were mixed, ground, pressed and then sintered at 950° C. in flowing oxygen gas.

Using these different ceramic targets, thin superconducting films were deposited upon target substrates. The targets were ablated using pulsed laser deposition (PLD) with a KrF excimer laser ($\lambda$=248 nm), at a repetition rate of 10 Hz. All of the depositions were carried out at the same substrate-to-target distance of 5 cm and an oxygen pressure of 200 mTorr. The target substrates were $SrTiO_3$ single crystals, $SrTiO_3$-buffered MgO single crystals, or $SrTiO_3$-buffered IBAD-MgO on Hastelloy, referred to herein as IBAD-MgO. After deposition at 760-790° C., samples were cooled to room temperature in oxygen at 300 Torr. Ten different doped samples were grown with thicknesses in the range of 0.5 to 1.7 µm.

For all the samples, inductive critical current temperature ($T_c$) and transport critical current density ($J_c$) measurements in self-field (i.e., in no applied field) at liquid nitrogen temperatures were made. Further transport measurements were conducted on some of the samples in liquid nitrogen, in a magnetic field rotated in a plane perpendicular to the plane of the film but always normal to the current (maximum Lorentz force configuration). Microstructural characterization was carried out by x-ray diffractometry (XRD), atomic force microscopy (AFM), and cross-sectional transmission electron microscopy (TEM).

Table 1 shows the measured data for three reference undoped YBCO films and several barium zirconate-doped YBCO films. There was, statistically, no difference in the $T_c$ and self-field $J_c$s between the undoped and doped YBCO films. The self-field $J_c$s of all the samples lie within the envelope of the standard $J_c$ versus thickness plot.

TABLE 1

(Sample data for reference YBCO films, and for YBCO + $BaZrO_3$ films on single-crystal STO, MgO-buffered single-crystal STO, and on STO-buffered-IBAD-MgO substrates)

| Sample Number | $T_c$ (breadth) (K) | Self-field $J_c$ (at 75.5 K) | Thickness (µm) | Substrate |
|---|---|---|---|---|
| pure YBCO reference films ||||
| 1 | 91.7 (0.7) | 2.4 | 1.55 | STO |
| 2 | 91.5 (0.5) | 2.6 | 1.0 | STO |
| 3 | 92 (3) | 2.3 | 1.2 | STO on IBAD |
| YBCO films with $BaZrO_3$ ||||
| 11 | 91 (1) | 2.4 | 0.5 | STO |
| 12 | 92 (2) | 2.3 | 1.7 | STO |
| 13 | 91.5 (1) | 2.2 | 1.3 | STO |
| 14 | 89.5 (2.5) | 2.0 | 0.75 | STO |
| 15 | 87.8 (0.5) | 2.2 | 1.0 | STO |
| 16 | 90 (1) | 1.8 | 1.3 | STO on MgO |
| 17 | 89 (1) | 1.5 | 1.2 | STO on MgO |
| 18 | 87.5 (1.5) | 1.7 | 0.9 | STO on MgO |
| 19 | 88 (1) | 2.0 | 1.0 | STO on MgO |
| 20 | 88.7 (2) | 2.6 | 1.2 | STO on MgO |

Figure 2:
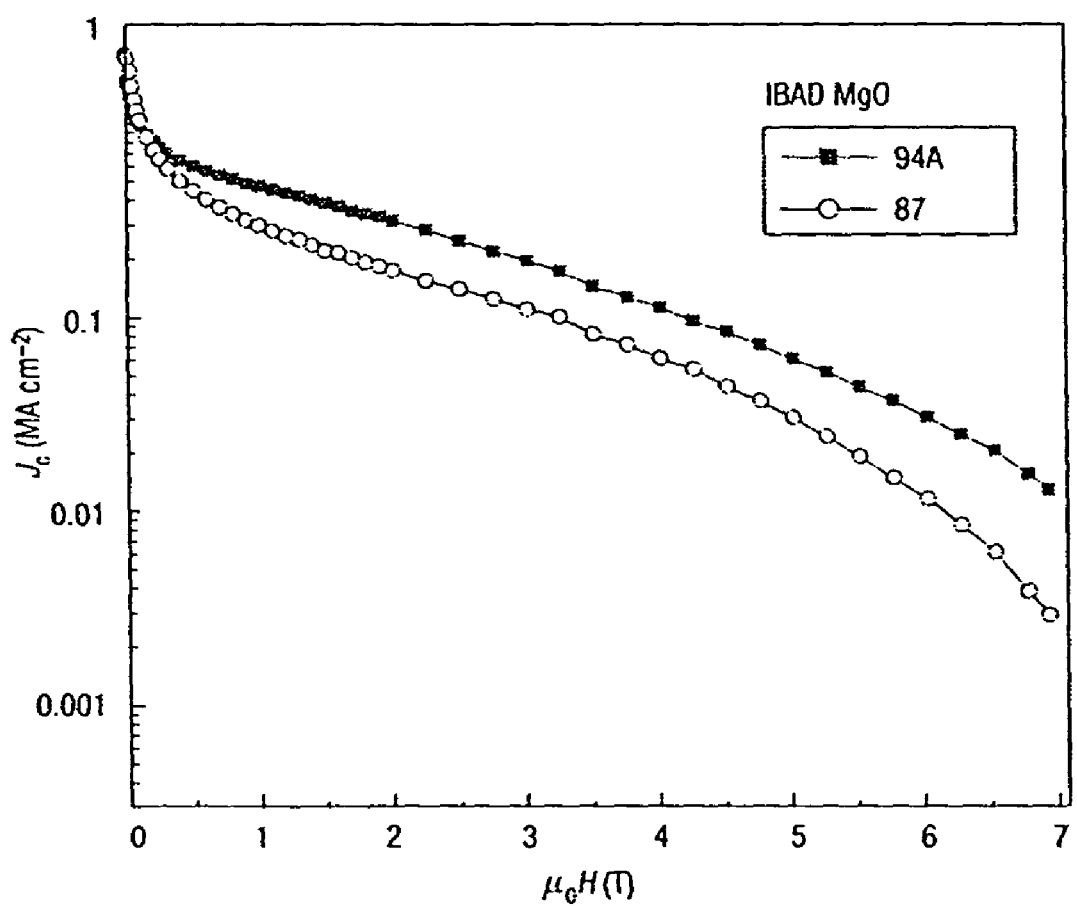
FIG. 2 shows a graph plotting normalized critical current ($J_c/J_c^{sf}$) versus magnetic field parallel to the c-axis at T=75.5 K for a barium zirconate and yttium oxide doped YBCO sample grown on an IBAD-MgO substrate (an IBAD-MgO substrate is a base substrate having a layer of MgO deposited by an ion beam assisted deposition process, such a process described, e.g., in U.S. Pat. No. 5,872,080).

FIG. 1 shows normalized ($J_c/J_c^{sf}$ where $J_c^{sf}$ is self-field $J_c$) versus magnetic field parallel to the c axis (H||c) comparing $BaZrO_3$-doped YBCO films and pure YBCO films on $SrTiO_3$ single crystals. FIG. 2 shows $J_c$ versus magnetic field (||c) comparing $BaZrO_3$-doped YBCO films and pure YBCO films on IBAD-MgO. The comparisons were made with pure YBCO samples that exhibited reproducibility of $J_c$ versus field from one pure YBCO sample to another, for given single crystal substrates and for films of the same $T_c$. This was also the case for samples with the same $T_c$ made on the same batch of IBAD-MgO. Hence, the doped and pure YBCO samples were grown on the same batch of IBAD-MgO.

The striking result seen in both FIG. 1 and FIG. 2 is the upwards shift in normalized $J_c$ for the $BaZrO_3$-doped YBCO samples. Identical behaviors were observed for other samples measured on single crystal substrates. Even though the $BaZrO_3$-doped YBCO samples of FIG. 1 have slightly lower $T_c$ measurements than the pure YBCO samples, the in-field $J_c$ values were improved significantly. Hence, the presence of the $BaZrO_3$ has clearly increased the irreversibility field. On both the single crystal substrates and IBAD-MgO substrates, the $J_c$ values were around a factor of 1.5-2 higher over a wide field range (from about 1 to 5 Tesla) and the $J_c$ values increased to a factor of around 5 at even higher fields (from 5 to 7 Tesla). In thick YBCO films (about 1 µm) including the $BaZrO_3$, the $J_c$ values remained in excess of 0.1 MA/cm² at 4.5 T. It was noted that the small differences in thickness of the films of FIG. 1 do not explain the different forms of the curves (i.e., within the thickness range studied, pure YBCO samples of differing thickness gave near-identical plots).

The inset of FIG. 1 shows the angular dependence of $J_c$ measured in a field of IT for the samples on STO single-crystal. A shift upwards in the relative height of the c-axis angular peak was observed for the $BaZrO_3$-doped YBCO sample compared to the pure YBCO sample, indicative of strong pinning defects along the c-axis in the $BaZrO_3$-doped YBCO film. In fact, the $J_c$ was increased substantially compared to the pure sample across the angular range from 0° to about 80°. The same trend was also observed for samples on IBAD-MgO. This result is important for applications of coated conductors, since the magnetic field will rarely be constrained to a single orientation. Previous measurements of the $J_c$ (H||c) dependences for pure YBCO films on STO, single crystal STO and IBAD-MgO substrates have been shown to be very similar, suggesting a similar pinning mechanism on different substrates.

Figure 3:
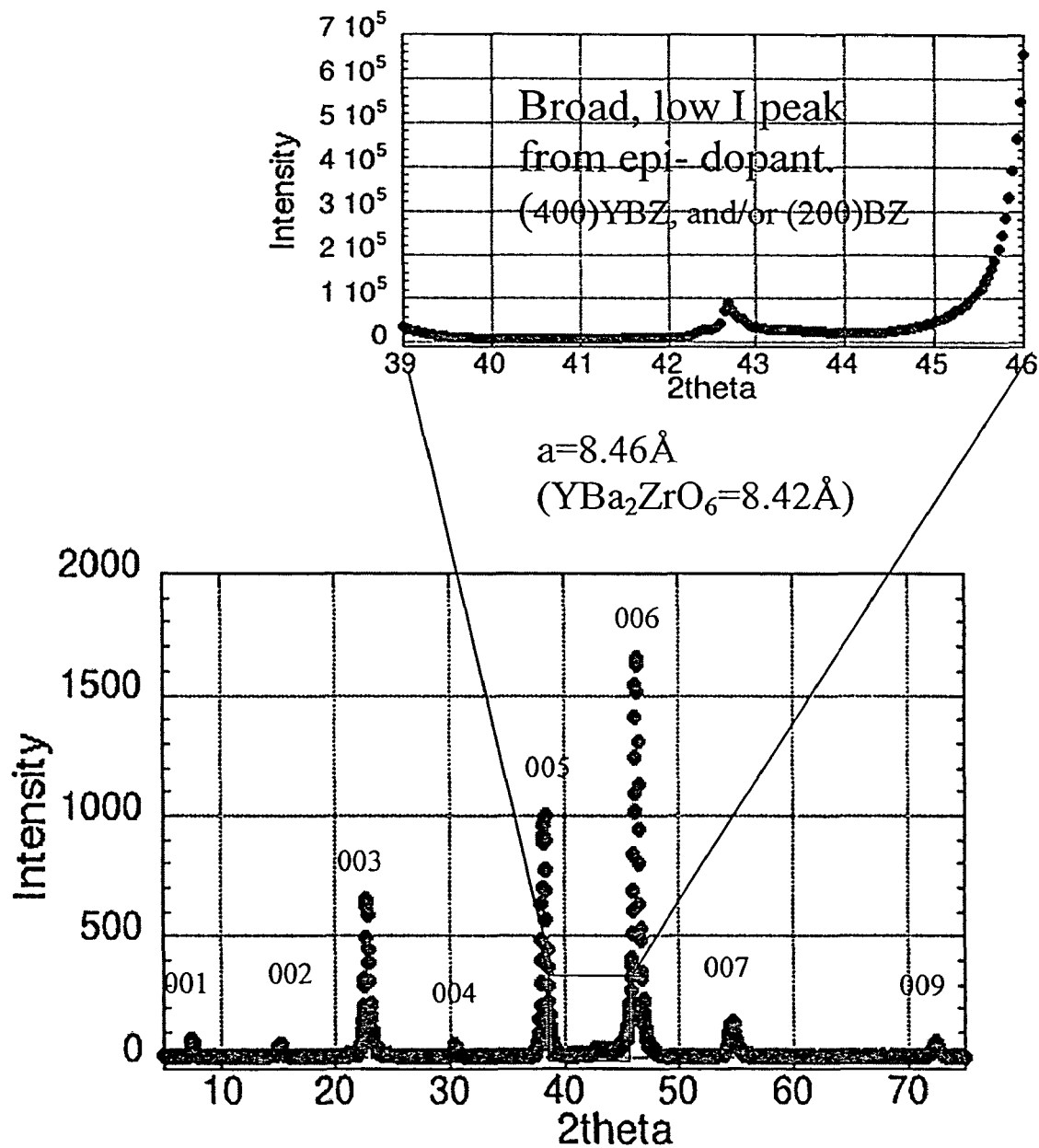
FIG. 3 shows an x-ray diffractogram of a barium zirconate doped YBCO sample in accordance with the present invention.
Figure 4:
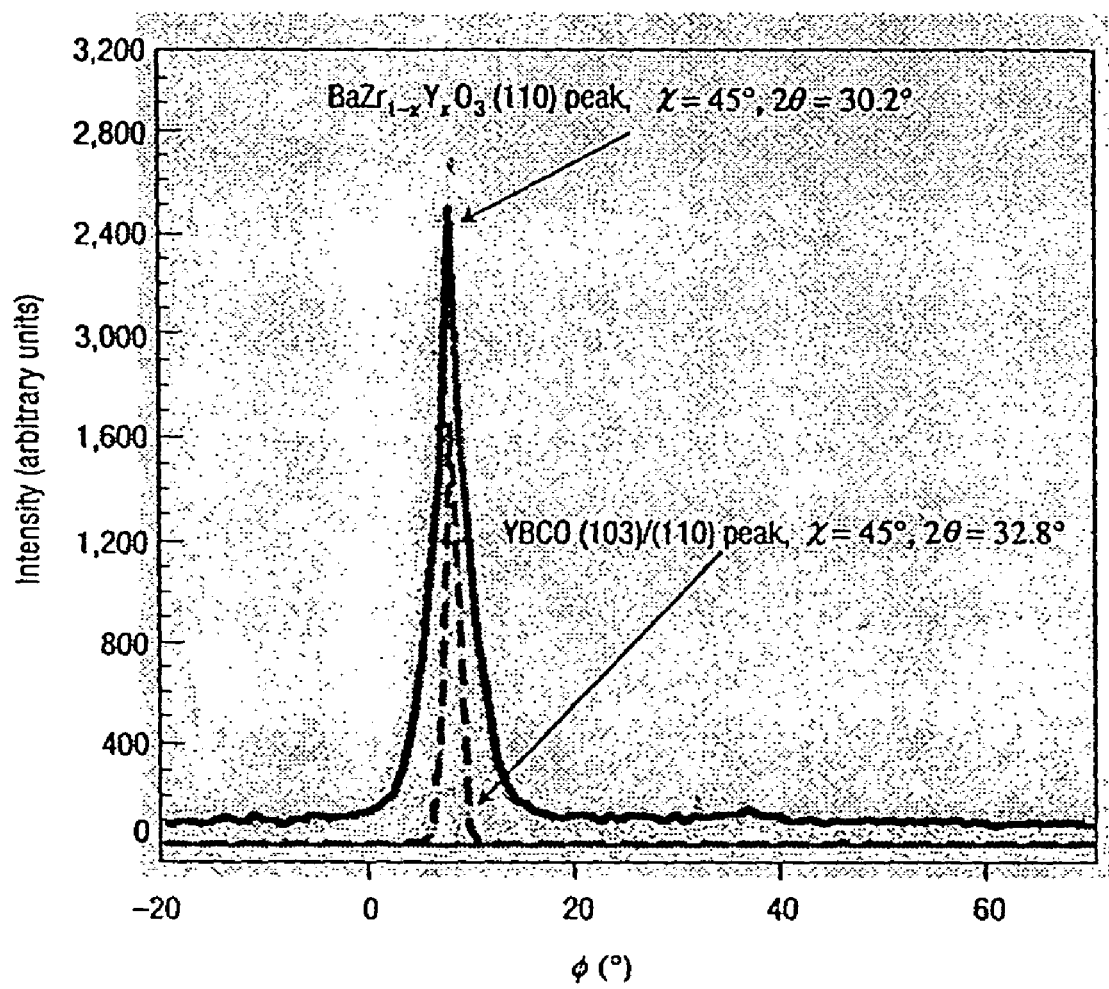
FIG. 4 shows an XRD plot showing in-plane alignment of YBCO and $BaZrO_3$ particles from φ scans of a barium zirconate doped YBCO sample in accordance with the present invention at χ=45°, 2θ=30.2° corresponding to the $BaZrO_3$ (110) peak, and 2θ=32.8° corresponding to the YBCO (103)/(110) peak.

X-ray diffractograms (FIG. 3) of $BaZrO_3$-doped YBCO films show peaks belonging to (001) YBCO plus an additional, broad, low intensity peak centered around $2\theta=42.7°$, which is consistent with (200) $BaZrO_3$, and/or (200) $Ba_2Zr_{2-x}Y_xO_6$, and/or (400) $Ba_2ZrYO_6$. It is noted that the $Ba_2ZrYO_6$ phase has not been widely reported previously, on the general assumption that $BaZrO_3$ does not react with YBCO. However, the breadth and position of the second phase peak suggests that $Ba_2Zr_{2-x}Y_xO_6$ particles with a range of x values were present. As shown from x-ray $\phi$ scans (in FIG. 4) of the YBCO (103/110) and $BaZrO_3$ (110) peaks at $\chi=45'$ and $2\theta=32.8°$ and $30.2°$, respectively, the particles were in-plane aligned cube-on-cube with the YBCO.

Nanoparticles were observed distributed across the film surface in AFM micrographs of a $BaZrO_3$-doped YBCO film on STO. These particles were not observed in pure YBCO films. The phase contrast image indicated that the particles were composed of a phase different from YBCO. Cross-sectional low magnification and high-resolution TEM micrographs confirmed the presence of nanoparticles embedded in the YBCO lattice. In addition, c-aligned, misfit edge dislocations of spacing <50 nm were present in the YBCO. The minimum density of columnar defects was at least 400 $\mu m^{-2}$, compared with about 80 $\mu m^{-2}$ previously observed in YBCO films grown by PLD. The dislocations form a family of correlated linear defects that should produce substantial uniaxial pinning along the c direction, consistent with the observed enhancement of the c-axis peak in $J_c$ (the inset of FIG. 1). While not wishing to be bound by the present explanation, it appears that the dislocations form as a result of the lattice misfit between the particles and matrix. On the basis of the film and particle lattice parameters of about 3.85 and 4.23 Å, respectively, the level of strain is around 9.4 percent. The high defect density is consistent with the reduced $T_c$s and self-field $J_c$s of some of the samples. Although the c-axis dislocations are the source of the enhanced directional pinning, it is possible that some random pinning may also arise directly from the nanoparticles.

Lattice images and fast Fourier transformations of the particles indicated a cubic structure, with lattice parameter $a\approx4.23$ Å, consistent with $BaZr_{1-x}Y_xO_3$. Owing to the small size of the particles, it was not possible to conclusively determine their composition. A typical particle size distribution measured over a 1 $\mu m^2$ area ranged in size from 5 nm to 100 nm with a modal or mean particle size of 10 nm.

From the present results it is concluded that by implementing a straightforward and inexpensive target compositional modification, $J_c$ enhancements of up to a factor of about 5 (depending on field) at liquid nitrogen temperatures can be achieved in a reproducible way on both single-crystal and buffered metallic substrates. It may be expected that heteroepitaxial second-phase additions other than $BaZrO_3$ can also lead to enhancements in flux pinning.

Although the present invention has been described with reference to specific details, it is not intended that such details should be regarded as limitations upon the scope of the invention, except as and to the extent that they are included in the accompanying claims.

What is claimed is:

1. A method of forming a superconductive oxide thin film comprising:
    depositing a thin film of a $Y_1Ba_2Cu_3O_{7-\delta}$ high temperature superconductive oxide from materials consisting essentially of (i) precursor materials for said $Y_1Ba_2Cu_3O_{7-\delta}$ high temperature superconductive oxide and (ii) a group 4 metal or group 5 metal containing precursor material whereby said resultant $Y_1Ba_2Cu_3O_{7-\delta}$ superconductive oxide thin film includes particles randomly dispersed therein, said particles consisting of either barium, oxygen and said group 4 metal or group 5 metal or of barium, yttrium, oxygen and said group 4 metal or group 5 metal.

2. The method of claim 1 wherein said metal 4 or metal 5 containing precursor material is a zirconium compound.

3. The method of claim 1 wherein said deposition is by pulsed laser deposition.

4. The method of claim 2 wherein said particles randomly dispersed therein are comprised of barium and zirconium.

5. The method of claim 2 wherein said $Y_1Ba_2Cu_3O_{7-\delta}$ high temperature superconductive oxide further includes a minor amount of a second rare earth metal.

6. The method of claim 2 wherein said zirconium compound is zirconium oxide.

7. The method of claim 2 wherein said superconductive oxide thin film including said zirconium compound has flux pinning centers such that said superconductive oxide thin film has a higher critical current within a magnetic field than such a superconductive oxide thin film in the absence of said zirconium compound.

\* \* \* \* \*